United States Patent [19]

Nakatsugawa

[11] 4,376,154

[45] Mar. 8, 1983

[54] COPPER FOIL FOR A PRINTED CIRCUIT AND A METHOD FOR THE PRODUCTION THEREOF

[75] Inventor: Hiroshi Nakatsugawa, Yokohama, Japan

[73] Assignee: Furukawa Circuit Foil Co., Ltd., Tokyo, Japan

[21] Appl. No.: 199,497

[22] Filed: Oct. 22, 1980

[30] Foreign Application Priority Data

Apr. 27, 1979 [JP] Japan .................................. 54-52154

[51] Int. Cl.³ .......................... C25D 3/30; C25D 3/22
[52] U.S. Cl. .................................... 428/607; 428/647; 428/646; 428/674; 428/658; 204/43 Z; 204/43 S
[58] Field of Search ............... 428/606, 607, 658, 646, 428/647, 676, 684; 204/12, 13, 27, 28, 43 Z, 54 L, 43 S; 174/126 CP; 156/150, 151

[56] References Cited

U.S. PATENT DOCUMENTS

| | | | |
|---|---|---|---|
| 3,857,681 | 12/1974 | Yates | 204/27 |
| 4,049,481 | 9/1977 | Morisaki | 204/43 Z |
| 4,082,591 | 4/1978 | Morisaki | 156/150 |
| 4,251,329 | 2/1981 | Asano | 204/27 |

FOREIGN PATENT DOCUMENTS

| | | |
|---|---|---|
| 643817 | 6/1962 | Canada . |
| 55-102288 | 8/1980 | Japan . |
| 786768 | 11/1957 | United Kingdom . |
| 173003 | 8/1965 | U.S.S.R. . |

OTHER PUBLICATIONS

*Chemical Abstracts,* Abstract No. 77:38154f, Sebisty, J. J.; "Elevated Temperature Peeling Failure of Galvanized Coatings", 1977.

*Metal Industry,* vol. 37, "Alkaline Tin Plating Bath", Heiman, S. et al., Apr. 1939, pp. 161-164.

*Primary Examiner*—L. Dewayne Rutledge
*Assistant Examiner*—J. J. Zimmerman
*Attorney, Agent, or Firm*—Frishauf, Holtz, Goodman & Woodward

[57] ABSTRACT

A copper foil for a printed circuit comprising a copper layer having the bonding surface coated with a tin layer and having said tin layer coated with a vanadium-containing zinc layer which optionally may be given a chromic acid treatment. The invention also provides a method for producing said copper foil.

17 Claims, No Drawings

COPPER FOIL FOR A PRINTED CIRCUIT AND A METHOD FOR THE PRODUCTION THEREOF

The present invention relates to copper foil for a printed circuit and a method for the production thereof. Particularly, the present invention relates to copper foil to be used for the production of a copper laminated board for a printed circuit, which comprises a copper layer (i.e., copper foil material) and a tin layer and a vanadium-containing zinc layer coated thereon, and a method for the production thereof. The copper foil for a printed circuit according to the present invention will hereinafter be referred to as "the copper foil of the present invention".

Printed circuits are widely used in a variety of electronic application such as radios, televisions, computors, or telephone exchanges. There have recently been remarkable developments in this field and accordingly there is an increasing need for high quality board for printed circuits.

With conventional copper laminated boards for printed circuits, it frequently happens that brown stains or spots appear at the interface between the copper foil and the substrate resin layer. The surface which is in contact with the resin layer will hereinafter be referred to as "a bonding surface of the copper foil". Such stains impair the outer appearance of the circuit and adversely affect the dielectric properties of the resin. Further, there has been a recent tendency that an increasing number of heat treatments at high temperatures are involved during the process for the production of boards for printed circuits, whereby the adhesion between the copper foil and the resin is likely to be deteriorated due to thermal degradation thus leading to a serious practical problem. The formation of the brown stains and the deterioration in the adhesion between the copper foil and the resin, are believed to be caused mainly by chemical reactions between the copper foil and the resin layer. However, no adequate analysis of the causes has yet been done.

The following methods have been proposed to overcome these drawbacks.

U.K. Pat. No. 1211494 describes a method in which 0.2 to 1.0 g/m$^2$ of nickel, cobalt, chromium or stainless steel is plated on the bonding surface of the copper foil for a printed circuit. Japanese Patent Publication No. 35711/1976 discloses a method in which at least $10.16 \times 10^{-6}$ cm (i.e., 4 microinches) of indium, zinc, tin, nickel, cobalt, copper-zinc or copper-tin alloy is electrodeposited on the surface of copper foil. Further Laid-Open Japanese Patent Application No. 16863/1974 describes a method in which a layer of a metal which is less noble than copper, such as aluminum, chromium, manganese, iron, cobalt, nickel, zinc, cadmium, tin, lead or indium, or its alloy with copper or with other metals, such as copper-zinc, copper-cadmium, copper-tin, or tin-zinc, is formed on the surface of copper foil.

Among these metals to form a layer on copper foil, nickel, tin, cobalt and a copper-tin alloy, have a drawback that they are hardly dissolved by an ammonium persulfate solution which is one of the etchants commonly used in the printed circuit operations.

On the other hand, in the method for plating a zinc layer or a copper-zinc alloy layer, it is necessary to form the metal layer to have a thickness of substantially more than $10.16 \times 10^{-6}$ cm in order to obtain sufficient effectiveness for preventing stain formation and thermal degradation. However, a thick metal layer brings about the following drawbacks, and thus there are still difficult practical problems with copper foil having such a metal layer.

One of the drawbacks is that in the case of zinc plating, a so-called undercutting phenomenon occurs wherein the etchant penetrates into the interface between the copper foil constituting the printed circuit and the substrate beneath the copper foil, unless the plated metal layer is sufficiently thin. Another drawback is that the purity of the copper foil in terms of copper content, is lowered due to the thick plated metal, whereby electrical properties of the copper foil are degraded. Specifically, if zinc or a 35% zinc-copper alloy is plated on copper foil of a thickness of 35$\mu$, which is most commonly used for printed circuits, to have the above-mentioned thickness, i.e., $10.16 \times 10^{-6}$ cm, the zinc content becomes about 0.24% or about 0.1%, respectively, of the total amount. Recently, with improvement of boards for printed circuits, there is a tendency that the thickness of the copper foil becomes thinner than ever e.g., to a level of 18$\mu$, 12$\mu$, or even 5$\mu$. Accordingly, the proportion of zinc in such thin copper foil tends to increase and it becomes harder to obtain the desired level of performance for the copper foil. A further drawback is that with increase in the thickness of the plated layer, it becomes harder to control the coarseness of the foil surface. A still further drawback is that it is disadvantageous and not economical from the standpoints of the time required for the treatment and the costs for the plating materials to use a thick plated layer. Another drawback is that in the case of electroplating a zinc-copper alloy, there is no other practical way than employing a cyanide bath which brings about difficult problems in respect of working environment and pollution.

When copper foil for a printed circuit is laminated upon a substrate, the copper foil may be used either as an outer layer of a copper laminated board or as an inner layer of a multi-layer copper laminated board. In the latter case, both sides of the copper foil are employed as bonding surfaces, and in the former case, one side of the copper foil is employed as the above-mentioned bonding surface while the other side thereof is exposed on the surface of a completed printed circuit so that the exposed side is later printed with a resist ink and treated with a solder. The surface which does not contact the resin layer will hereinafter be referred to as "non-bonding or untreated surface".

With conventional copper foil for a printed circuit, a so-called untreated surface (untreated-side or shiny side) of the copper foil constituting a circuit pattern, tend to be oxidized and undergo a color change due to the heat at the time it is laminated on the substrate, thus giving an inferior outer appearance and providing poor affinity to a resist ink and poor solderability. Even when there is no color change, there still remains a drawback that the solderability is not adequate for recent high speed soldering. In view of these points, it has been desired that the treatment to form on the surface of copper foil a layer of other metal, should not impair the required properties such as good outer appearance of the untreated surface of the copper foil, affinity to a resist ink and solderability, but rather improve them.

In view of the above mentioned drawbacks inherent to the conventional operations, it is an object of the present invention to provide copper foil for a printed circuit, which overcomes various problems relating to the bonding surface and untreated surface of the copper foil for a printed circuit, and to provide a method for its production. The copper foil for a printed circuit according to the present invention, is the one which is free from formation of stains at the interface with the substrate resin, provides a strong adhesion before and after the heating and is free from the undercutting phenomenon. Further, the untreated surface thereof does not undergo a color change by oxidation at the time of lamination, provides good solderability and has a corrosion preventive property.

The copper foil for a printed circuit according to the present invention comprises a copper layer, a tin layer formed on one side or each side of said copper layer and a vanadium-containing zinc layer formed on said tin layer.

Now, the copper foil for a printed circuit according to the present invention will be described in more detail.

Copper foil for the basic copper layer may be any copper foil normally used for a printed circuit, for instance, such as electrodeposited copper foil or rolled copper foil. Further, it may have been subjected to a surface roughening treatment such as etching by acid pickling, or a surface roughening treatment by electrodeposition as disclosed in U.S. Pat. No. 3,220,897 or 3,293,109.

The zinc layer formed on the bonding surface of said copper foil, is intended to prevent the formation of stains at the interface and to provide a heat resistant adhesion with the substrate resin, and should preferably have a thickness of 0.002 to $0.5\mu$, more preferably 0.01 to $0.3\mu$. With a thickness of less than $0.002\mu$, said effects can not be expected, and if the thickness exceeds $0.5\mu$, there appear the above-mentioned drawbacks resulting from the excessive thickness.

It is necessary that in the zinc layer, vanadium is dispersed uniformly, and the content of vanadium should be 0.05 to 10% by weight, preferably 0.2 to 6% by weight, on the basis of the amount of zinc. The vanadium content in the zinc layer is effective primarily to decrease the undercutting phenomenon, and to provide good adhesion with a phenol resin substrate, especially with a non-inflammable phenol resin substrate (before and after the heating), and its presence at the untreated surface does not bring about the color change due to the oxidation of the copper foil surface at the time of lamination, and does not adversely affect the solderability, thus bringing about no adverse effects. If the vanadium content is less than 0.05% by weight on the basis of the zinc amount, no appreciable effects are obtainable and on the other hand, if the content exceeds 10% by weight, current efficienty at the time of electrodeposition of the zinc layer becomes extremely poor and thus leads to a practical difficulty. A tin layer is present between the basic copper layer and said vanadium-containing zinc layer. Said tin layer should preferably have a thickness of 0.002 to $0.02\mu$, more preferably 0.005 to $0.015\mu$.

As mentioned above, in order to avoid the drawbacks resulting from the excessive thickness, the zinc layer should be as thin as possible so long as the desired effects are obtainable. If a zinc layer is directly formed on the copper foil, zinc tends to diffuse into the copper layer even at room temperature, and thus if a thin layer of zinc is formed directly on a copper foil, the zinc-plated surface undergoes a color change and becomes a brass (copper-zinc alloy) color within a period of one day to one month. Consequently, as time passes after the production, the products tend to have different color tones and thus bring about a disadvantage that the outer appearance of the products is not consistent, although there is no practical difference in their function. Strictly, there is a further disadvantage that as the zinc concentration at the bonding surface lowers as a result of the diffusion, its effects decrease correspondingly.

Whereas, the copper foil of the present invention has a tin layer formed between the copper layer and the vanadium-containing zinc layer, which tin layer serves to prevent the diffusion of zinc at room temperature, whereby no such disadvantages as mentioned above will be brought about. Namely, the diffusion of zinc at room temperature is prevented by the tin layer and the disadvantage that the color tones of the products undergo time change and the products tend to have different colors depending upon the number of days after the production, is thereby eliminated. However, depending upon the heating at the time of lamination, zinc diffuses into the copper layer to an appropriate extent to form a copper-zinc alloy surface layer. In this case, too, the diffusion is controlled as compared with the case wherein there is no tin layer, and it is possible to maintain the required zinc concentration at the bonding surface with a relatively small amount of zinc. The thickness of the zinc layer is within the thinner range as mentioned above thus being free from the disadvantages resulting from the thick zinc layers of the conventional type. Nevertheless, the zinc concentration at the surface is maintained at a required level and accordingly the effects of zinc, i.e., resistance against the formation of brown stains, resistance against the formation of greenish brown stains on the polyimide substrate, heat resistance for the adhesion with the resin substrate, and the adhesion with a non-inflammable substrate, are sufficiently obtainable.

On the other hand, if the tin layer is too thick, the tin concentration at the bonding surface becomes high as a result of the diffusion of tin by the heat at the time of lamination, and tends to lead to a disadvantage that at the time of etching by means of ammonium persulfate, the surface of the circuit substrate leave etching residue of a light black color. For instance, when the treatment was carried out in the same manner as in Example 1 presented hereinafter (electrodeposition of tin for a thickness of $0.009\mu$) with a modification that the thickness of tin was made slightly more than three times, etching residue of a light black color were observed. Accordingly, the thickness of the tin layer at the bonding surface should preferably be 0.002 to $0.02\mu$ as mentioned above, depending upon the thickness of the zinc layer and the heating conditions at the time of lamination. Within this range, it is possible to maintain the zinc concentration at the bonding surface at a sufficiently high level and to control the tin concentration at a low level. Thus, it is possible to effectively use the advantages of the zinc layer without accompanying the disadvantages of the tin layer such as the etching residue.

Further, the zinc layer formed on the untreated surface of the copper foil, thermally diffuses into the surface layer of the copper foil during the lamination and soldering, and it prevents the color change due to the oxidation at the time of the lamination and improves the solderability and the affinity to a resist ink. Further, the tin layer present between the copper layer and the zinc layer, also thermally diffuses into the copper foil surface during the lamination and the soldering thereby further improving the solderability of the untreated surface. It is especially effective when the flux has a weak soldering effect. In this case, it is desirous that the zinc layer and the tin layer are as thin as possible to such an extent that their presence can not be ascertained by a naked eye. The zinc layer should preferably be 0.0005 to 0.0015μ, more preferably about 0.001μ. The tin layer should preferably be 0.001 to 0.015μ, more preferably about 0.006μ. If the zinc layer and the tin layer are thinner than the above ranges, no appreciable effects of the respective layers can be expected. On the other hand, if the thickness of the zinc layer exceeds 0.002μ, the colour of the zinc plating can be noticed by a naked eye and thus gives a poor outer appearance, and the colour of brass alloy remains even after the heating at the time of lamination, and thus is undesirable.

The zinc layer on the untreated surface has the same composition as that described with reference to the bonding surface and it is composed of vanadium-containing zinc. The primary advantage of a a method wherein the zinc layer is applied to the untreated surface by means of the same zinc plating bath as used for the zinc plating on the bonding surface, is that in the continuous process for treatment of the copper foil material, it is possible to carry out the zinc plating on both sides of the copper foil simultaneously. The vanadium-containing zinc layer provides mainly unpositive effects such that it does not adversely affect the color change by oxidation of the copper foil at the time of lamination, the solderability, the printability of a resist ink and susceptibility to etching. Nevertheless, such effects are practically very advantageous.

According to a preferred embodiment of the present invention, a chromic acid treated coating (chromate layer) is provided on the surface of the vanadium-containing zinc layer. A bonding surface having this chromate layer provides a stronger adhesion with the substrate resin. The improvement in the adhesion is especially distinct when a butyral-phenol resin type adhesive is applied on said chromate layer, and such adhesive coated foil is laminated on a phenol resin substrate. In the case of a substrate of glass-epoxy resin (i.e., glass fiber reinforced epoxy resin), the effect is not so distinct as in the case of the phenol resin substrate since the effect of the vanadium-containing zinc layer is substantial, but even then, the adhesion is substantially improved as compared with the case wherein there is no such chromate layer.

Of course, an improvement in the corrosion resistance of the bonding surface, is one of the effects obtainable by the chromic acid treatment. On the other hand, if the chromate layer is provided on the untreated surface, its main effect resides in the improvement in the corrosion resistance, and the one treated with an alkaline chromic acid bath is superior to the one treated with an acidic chromic acid bath in its effects for preventing the color change by oxidation of the copper foil at the time of lamination, the solderability and susceptibility to etching.

Now, the method for producing the copper foil according to the invention will be described.

The formation of the tin layer and the zinc layer on the copper layer, may be made by any method such as an electroplating method, a chemical plating method, a sputtering method or an organic solvent electrodeposition method. The electroplating method is most preferred.

The production of the foil by means of the electroplating method will be described hereinbelow;

The tin plating bath may be any one selected from a sulfuric acid acidic bath, a borofluoride bath, and an alkaline stannate bath which are widely used in industry. The alkaline stannate bath is particularly preferred for the reasons that a good coating is obtainable from the inexpensive bath having a simple composition without requiring additives and that the solderability of the untreated surface thus obtained is superior to that obtainable from an acidic bath, when a flux having a weak soldering effect is used. In the examples, a bath comprising sodium stannate and sodium hydroxide is shown, but a tin plating bath containing a potassium salt is likewise useful. Further, additives such as sodium acetate or potassium acetate may appropriately be added to the bath. The bath is operated normally at a temperature of 60° to 90° C. However, the bath temperature may be lower or higher than this range. The current density is normally 0.5 to 5 $A/dm^2$, but may be higher or lower than this range. In the case of the bath used in Example 1 presented hereinbelow, a current density of about 1 $A/dm^2$ is desirable to obtain a uniform tin plating and in view of the treatment efficiency and the convenience for handling.

Next, for the zinc plating, a zinc electroplating bath with a vanadium compound dissolved therein, is used. Following the normal procedure, a zinc layer is formed on the tin plated layer. When an electroplating method is employed in the present invention, the plating conditions such as the composition of the zinc plating bath, the bath temperature and the current density, may be similar to the conditions in an ordinary zinc electroplating method except for the addition of a vanadium compound. The method may not be a specific one. The electroplating bath may be any one selected from a cyanide bath, an alkaline bath and an acidic bath. However, it is preferred to use an alkaline bath for the reasons that a good coating is obtainable from an inexpensive and almost harmless bath having a simple composition with no additives, that co-deposition of vanadium can readily be conducted and that undercutting is minimized. The examples illustrate a bath which contains zinc sulfate or zinc oxide as principal element and in which sodium hydroxide is employed. However, other alkaline zinc baths may likewise be used, and an additive such as a brightening agent (brightener) may be added as the case requires. The bath is normally kept at room temperature, but may be heated. Further, the current density is normally within a range of 0.1 to 10 $A/dm^2$ but may be lower or higher. In the solution of Example 1 presented hereinafter, electroplating was observed even at a current density of 0.1 $A/dm^2$ and it was confirmed that the zinc layer contained vanadium. However, more uniform electroplating can be attained at 0.2 $A/dm^2$ or more. A current density of 1 $A/dm^2$ or more is preferred from the standpoint of the treating speed of the bonding surface. The vanadium compound to be added to the zinc solution may be any vanadium compound which is soluble in the zinc solution, such as ammonium metavanadate, sodium metavanadate, sodium orthovanadate, vanadium pentoxide, vanadium oxyoxalate, vanadium acetylacetone or vanadyl sulfate. The amount of these metal salts to be added to the electrolytic bath is at least 0.01% by weight, preferably at least 0.1% by weight, as metal based on the amount of zinc in the bath. For instance, in case ammonium metavanadate is added to an alkaline zinc bath at room temperature and containing 5.5 g/l of zinc, the effect becomes distinct when the added amount is at least 0.01 g/l as vanadium.

As mentioned above, the zinc plating can uniformly be done with use of either a sulfate bath or an alkaline bath such as sodium zincate without such drawbacks as in the case of zinc-copper plating (cyanide bath).

Further, the control can easily be done as the zinc plating does not require a special alloy plating bath as required for tin-zinc plating. Thus, the production method of the present invention can be practiced as an easy method for plating tin and zinc and has an advantage that the amounts of the electrodeposition of tin and zinc and the vanadium content in the zinc layer, can easily be controlled. Further, in order to form a chromate layer on the zinc layer after forming the tin layer and the vanadium-containing zinc layer on the copper layer, the surface of the zinc layer of the copper foil is, for instance, washed with water, and then treated with an alkaline chromic acid solution (e.g., chromic acid: 0.1 to 10 g/l, sodium hydroxide: 0.1 to 10 g/l) or a solution of chromic acid only (e.g., 0.1 to 10 g/l). As the treating method, there may be used dipping, cathodic electrolysis or anodic electrolysis. In the treatment, a cold or hot solution containing chromic acid may be used.

With the copper foil comprising a thin layer and a vanadium-containing zinc layer and further provided thereon with a chromate layer according to the present invention, the diffusion of zinc into the copper at room temperature is slow, and accordingly the bonding surface of the copper foil maintains its zinc colour for a long period of time after the production, there is little colour change of the product with time, and both the bonding surface and the untreated surface of the copper foil have a sufficient corrosion preventive property for practical purposes. Further, when used as an electroconductive element of a copper clad laminated board for a printed circuit, said copper foil showed the following excellent results.

Namely, after its lamination to a glass-epoxy resin substrate, no brown stain was observed at the interface between the copper foil and the substrate resin layer, and the bond strength after the lamination was found to be sufficient and did not degraded very much even when heated at 300° C. for 3 minutes or at 180° C. for 5 hours. When subjected to the etching treatment, the portions of the foil to be etched were easily and completely removed, and penetration of the etching solution into the interface between the copper foil and the substrate resin (i.e., undercutting), which would be observed in the case of a zinc layer containing no vanadium, was not observed.

Further, when the copper foil was laminated on a polyimide substrate, the greenish brown stains, which would be observed on the substrate after the removal of copper by etching the conventional copper foil, were not observed with use of the copper foil treated by the present invention. Furthermore, when the copper foil was laminated on a phenol resin substrate, the bond strength was improved, and especially when the copper foil was laminated on a phenol resin type noninflammable substrate, the bond strength was remarkably increased.

Further, when heated and pressed for formation of a laminated board, conventional copper foil tends to be oxidized at its surface and undergo a color change. No such a color change was observed in the case of the present invention, and the solderability at the time of soldering was quite satisfactory.

It is apparent from the above description that the copper foil of the present invention is free from the drawbacks in quality inherent to the conventional products, has an improved quality, shows a lower rate of defective products and does not require a grinding (buffing) step, thus providing qualitative and economical advantages.

Further, the copper foil of the present invention includes not only the one having the tin layer and the vanadium-containing zinc layer on both surfaces, i.e., the bonding surface and the untreated surface, but also the one having these metal layers only on one surface.

The production method of the present invention can be carried out continuously by passing the copper foil material through a series of treating steps. Namely, a series of steps comprising firstly plating tin on both sides under the respective conditions, then after washing, plating zinc or both sides under the respective conditions, again washing, treating both sides with chromic acid under the respective conditions, and finally washing and drying, are suitable for industrial mass production.

Now, the invention will be described in more detail with reference to working examples. However, it should be understood that the present invention is not limited by these examples.

EXAMPLE 1

A solution containing 100 g. of sodium stannate (trihydrate) and 10 g. of sodium hydroxide per 1 liter at a temperature of 65° C. was used as the electrolytic bath. Tin was plated on the matte side (the bonding surface) of electrodeposited copper foil having a thickness of $35\mu$ at a current density of 1 A/dm$^2$ for 3 seconds and at the same time, tin was plated on the shiny side (the untreated surface) of the same electrodeposited copper foil at a current density of 1 A/dm$^2$ for 2 seconds. The amount of electrodeposition per apparent surface area of the matte side was $0.009\mu$ and the surface was slightly coloured with a tin colour. On the other hand, the shiny side remained to have a copper color. The plated foil was washed with water, and then subjected to electroplating with use of a solution containing 24 g/l of zinc sulfate (heptahydrate), 85 g/l of sodium hydroxide and 0.5 g/l of ammonium metavanadate at room temperature as the electrolyte. The electroplating was carried out on said matte side (the bonding surface) of the copper foil with a tin layer formed thereon, at a current density of 3.3 A/dm$^2$ for 5.6 seconds, and at the same time, on said shiny side (the untreated surface) of the copper foil, at a current density of 0.4 A/dm$^2$ for 2 seconds. The amount of electrodeposition of zinc per apparent surface area of the matte side, was about 0.33 g/m$^2$ which corresponds to a thickness of about $0.045\mu$, and the shiny side still remained to have a copper color. The foil was washed with water and dried, and then subjected to a measurement of the vanadium content in the zinc plated layer in a usual manner. The results obtained by the measurement are shown in Table 1. This copper foil was immersed in a solution having a chromic acid concentration of 3 g/l and a sodium hydroxide concentration of 3.4 g/l at room temperature for 5 seconds, washed with water and dried, and thereafter it was laminated on a glass-epoxy resin substrate thereby to obtain a laminated board. The results obtained by measuring various properties are also shown in Table 1.

EXAMPLE 2

The same treatments as in Example 1 were applied to the matte side and the shiny side of electrodeposited copper foil, except that a step of forming a chromate layer on the matte side was carried out by a cathodic electrolysis in a chromic acid-sodium hydroxide solution at 50° C. at a current density of 3 A/dm$^2$ for 3 seconds.

The results obtained by measuring various properties in the same manner as in Example 1, are shown in Table 1.

EXAMPLE 3

The same treatments as in Example 1 were carried out except that the zinc plating was applied to the matte side and the shiny side of electrodeposited copper foil, respectively, with use of a solution containing 12 g/l of zinc sulfate (heptahydrate), 65 g/l of sodium hydroxide and 1.2 g/l of sodium metavanadate at room temperature as the electrolytic bath. The amount of electrodeposition of zinc per apparent surface area of the matte side, was about 0.2 g/m$^2$ which corresponds to a thickness of about 0.027$\mu$, and the shiny side remained to have a copper colour.

The results obtained by measuring various properties in the same manner as in Example 1, are shown in Table 1.

EXAMPLE 4

The same treatments as in Example 1 were carried out except that the zinc plating was applied to the matte side and the shiny side of electrodeposited copper foil, respectively, with use of a solution containing 18 g/l of zinc sulfate (heptahydrate), 70 g/l of sodium hydroxide and 0.4 g/l of vanadium pentoxide at room temperature as the electrolytic bath.

The amount of electrodeposition of zinc per apparent surface area of the matte side, was about 0.3 g/m$^2$ which corresponds to a thickness of about 0.04$\mu$, and the shiny side remained to have a copper colour.

The results obtained by measuring various properties in the same manner as in Example 1, are shown in Table 1.

EXAMPLE 5

The same treatments as in Example 1 were carried out except that with use of a solution containing 4 g/l of zinc oxide, 50 g/l of sodium hydroxide and 0.6 g/l of ammonium metavanadate at room temperature as the electrolytic bath, the zinc plating was applied to the matte side of electrodeposited copper foil at a current density of 6 A/dm$^2$ for 7 seconds and at the same time the zinc plating was applied to the shiny side of said electrodeposited copper foil at a current density of 0.2 A/dm$^2$ for 6 seconds.

The amount of electrodeposition of zinc per apparent surface area of the matte side, was about 0.3 g/m$^2$ which corresponds to a thickness of about 0.04$\mu$, and the shiny side remained to have a copper colour.

The results obtained by measuring various properties in the same manner as in Example 1, are shown in Table 1.

COMPARATIVE EXAMPLE 1

With use of a solution containing 18 g/l of zinc sulfate (heptahydrate) and 70 g/l of sodium hydroxide at room temperature as the electrolyse, zinc plating was applied to the matte side and the shiny side of an electrodeposited copper foil, respectively, under the same conditions as in Example 4. The amount of electrodeposition of zinc per apparent surface area of the matte side, was about 0.33 g/m$^2$ which corresponds to a thickness of about 0.045$\mu$, and the shiny side remained to have a copper colour.

The results obtained by measuring various properties after the same treatments as in Example 1 are shown in Table 1.

COMPARATIVE EXAMPLE 2

The same electrodeposited copper foil as used in the above experiments, was subjected to the same chromic acid treatment as in Example 1 without applying the tin plating and the zinc plating. The results obtained by measuring various properties in the same manner as in Example 1 are shown in Table 1.

COMPARATIVE EXAMPLE 3

Copper foil obtained by the same treatments as in Example 3 except that no tin plating was applied, was compared with the copper foil obtained by Example 1, and it was found that the former underwent a gradual colour change on its matte side over an extended period of about one month after the production and showed various kind of brass (copper-zinc alloy) colour at various stages, while no substantial colour change was observed with the latter. When soldered with use of a flux having a weak soldering effect, and comprising 25% by weight of water white rosin and 75% by weight of isopropyl alcohol, the latter showed a distinctly better solderability than the former.

The results obtained by measuring various properties in the same manner as in Example 1, are shown in Table 1.

TABLE 1

| | Shiny side (untreated surface) | | Matte side (bonding surface) | | | | | |
|---|---|---|---|---|---|---|---|---|
| | Colour change by oxidation of the shiny side at the time of lamination | Solderability | Ratio of vanadium to zinc in the zinc plated layer (% by weight) | Undercutting upon etching Etching condition A | Undercutting upon etching Etching condition B | Peeling strength of the copper foil laminated on the glass-epoxy substrate (Kg/cm)* No heating treatment after lamination | Peeling strength of the copper foil laminated on the glass-epoxy substrate (Kg/cm)* Heating treatment at 300° C. for 3 minutes after lamination | Brown stains observed on the substrate after removal of copper by etching |
| Example 1 | None | Good | 4 | None | None | 2.2 | 1.9 | None |
| Example 2 | None | Good | 4 | None | None | 2.2 | 1.9 | None |
| Example 3 | None | Good | 7 | None | None | 2.2 | 1.9 | None |
| Example 4 | None | Good | 2 | None | None | 2.2 | 1.9 | None |
| Example 5 | None | Good | 5 | None | None | 2.2 | 1.9 | None |
| Comparative Example 1 | None | Good | — | Large | Almost none | 2.1 | 1.6 | Almost none |
| Comparative Example 2 | Yes | Bad | — | None | None | 2.2 | 1.2 | Yes |
| Comparative Example 3 | None | Good | 7 | None | None | 2.1 | 1.8 | None |

Etching condition A: Etching was conducted at 45° C. for 15 minutes with use of an etchant containing 200 g/l of $CuCl_2 \cdot 2H_2O$ and 150 g/l of HCl.
Etching condition B: Etching was conducted at 45° C. for 13 minutes with use of an etchant containing 250 g/l of $(NH_4)_2S_2O_8$ and 50 g/l of $H_3PO_4$.
*Peeling strength test: JISC 6481 - 1976, Paragraphs 5-7.

EXAMPLE 6

Copper foil obtained by the same treatments as in Example 1 except that no chromic acid treatment was applied, was laminated to a phenol resin substrate via a butyral-phenol resin type adhesive. The result obtained by the measurement of the peeling strength is shown in Table 2.

EXAMPLE 7

Copper foil obtained by the same treatments as in Example 1, was laminated in the same manner as in Example 6. The result obtained by the measurement of the peeling strength is shown in Table 2.

EXAMPLE 8

Copper foil obtained by the same treatments as in Example 2, was laminated in the same manner as in Example 6. The result obtained by the measurement of the peeling strength is shown in Table 2.

COMPARATIVE EXAMPLE 4

Copper foil having a zinc layer containing no vanadium was prepared under the same conditions as in Comparative Example 1, and the copper foil was laminated in the same manner as in Example 6. The result obtained by the measurement of the peeling strength is shown in Table 2.

COMPARATIVE EXAMPLE 5

Copper foil having a zinc layer containing no vanadium, was prepared under the same conditions as in Comparative Example 1. After forming a chromate layer on it under the same conditions as in Example 2, it was washed with water and dried, and then laminated in the same manner as in Example 6. The result obtained by the measurement of the peeling strength is shown in Table 2.

TABLE 2

| | Chromic acid treatment | Peeling strength (Kg/cm) |
|---|---|---|
| Example 6 | None | 0.8 |
| Example 7 | Immersion at room temperature for 5 seconds | 1.5 |
| Example 8 | Cathodic electrolysis at room temperature at $3A/dm^2$ for 5 seconds | 2.1 |
| Comparative Example 4 | None | 0.5 |
| Comparative Example 5 | Cathodic electrolysis at room temperature at $3A/dm^2$ for 5 seconds | 1.1 |

I claim:

1. Copper foil for a printed circuit having a bonding surface which will subsequently be bonded to a resin substrate, which comprises a copper layer, a layer consisting essentially of tin coated on said bonding surface of said copper layer and a layer consisting essentially of vanadium-containing zinc coated on said tin layer.

2. The copper foil for a printed circuit as claimed in claim 1, wherein the vanadium content in the vanadium-containing zinc layer is 0.05 to 10% by weight based on the amount of zinc.

3. The copper foil for a printed circuit as claimed in claim 2, wherein the vanadium content in the vanadium-containing zinc layer is 0.02 to 6% by weight based on the amount of zinc.

4. The copper foil for a printed circuit as claimed in claim 1, wherein said vanadium-containing zinc layer has a chromate layer on its surface.

5. The copper foil for a printed circuit as claimed in claim 4, wherein the vanadium content in the vanadium-containing zinc layer is 0.05 to 10% by weight based on the amount of zinc.

6. The copper foil for a printed circuit as claimed in claim 5, wherein the vanadium content in the vanadium-containing zinc layer is 0.02 to 6% by weight based on the amount of zinc.

7. The copper foil for a printed circuit as claimed in any one of claims 1 to 5, wherein said tin layer has a thickness of 0.002 to 0.02μ and said vanadium-containing zinc layer has a thickness of 0.002 to 0.5μ.

8. The copper foil for a printed circuit as claimed in claim 7, wherein said tin layer has a thickness of 0.005 to 0.015μ and said vanadium-containing zinc layer has a thickness of 0.01 to 0.3μ.

9. The copper foil for a printed circuit as claimed in any one of claims 1 to 5, wherein a tin layer having a thickness of 0.001 to 0.015μ coats the other surface of said copper layer and a vanadium-containing zinc layer having a thickness of 0.0005 to 0.0015μ is coated on the tin layer which is coated on said other surface.

10. The copper foil for a printed circuit as claimed in claim 9, wherein said tin layer coated on the other surface of said copper layer has a thickness of about 0.006μ and said vanadium-containing zinc layer coated on the tin layer which is coated on said other surface has a thickness of about 0.001μ.

11. A method for producing copper foil for a printed circuit having a bonding surface which will subsequently be bonded to a resin substrate, which comprises coating a tin layer on at least one side of a copper layer by electroplating and coating a vanadium-containing zinc layer on said tin layer by electroplating.

12. The method as claimed in claim 11, wherein the step of forming a tin layer by electroplating is carried out with use of an alkaline stannate solution as the tin plating solution.

13. The method as claimed in claim 11, wherein the step of forming a vanadium-containing zinc layer is carried out with use of a zinc plating solution in which a vanadium compound is dissolved.

14. The method as claimed in claim 13, wherein the zinc plating solution is an alkaline solution of a zinc salt.

15. The method as claimed in any one of claims 11 to 14, wherein the step of forming a vanadium-containing zinc layer is followed by a step of treating the surface of said vanadium-containing zinc layer with a chromic acid-containing solution.

16. The method as claimed in claim 15, wherein said chromic acid-containing solution is an alkaline solution of chromic acid.

17. The copper foil for a printed circuit as claimed in claim 8, wherein said vanadium-containing zinc layer has been given a chromate treatment by contacting said vanadium-containing zinc layer with chromic acid.

* * * * *